United States Patent
Lee (10) Patent No.: US 7,602,648 B2
(45) Date of Patent: Oct. 13, 2009

(54) PROGRAM METHOD OF FLASH MEMORY DEVICE

(75) Inventor: Hee Youl Lee, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 239 days.

(21) Appl. No.: 11/843,387

(22) Filed: Aug. 22, 2007

(65) Prior Publication Data

US 2008/0247236 A1 Oct. 9, 2008

(30) Foreign Application Priority Data

Apr. 3, 2007 (KR) .................. 10-2007-0032838

(51) Int. Cl.
*G11C 11/34* (2006.01)
(52) U.S. Cl. .............................. 365/185.19; 365/185.24
(58) Field of Classification Search ............ 365/185.19, 365/185.24, 185.22, 185.03
See application file for complete search history.

(56) References Cited

U.S. PATENT DOCUMENTS

| | | | |
|---|---|---|---|
| 6,442,070 B1 | 8/2002 | Tanaka et al. | |
| 6,700,820 B2 | 3/2004 | Elmhurst et al. | |
| 7,269,068 B2 * | 9/2007 | Chae et al. ............. | 365/185.18 |
| 7,286,413 B2 * | 10/2007 | Jeong et al. ............. | 365/185.28 |
| 7,372,754 B2 * | 5/2008 | Hwang et al. ............. | 365/218 |
| 7,539,057 B2 * | 5/2009 | Hwang et al. ........... | 365/185.19 |

FOREIGN PATENT DOCUMENTS

| KR | 1020010056072 A | 7/2001 |
|---|---|---|
| KR | 1020030031652 A | 4/2003 |

* cited by examiner

*Primary Examiner*—Anh Phung
(74) *Attorney, Agent, or Firm*—Townsend and Townsend and Crew LLP (57) ABSTRACT

A method for operating a flash memory device includes applying a first program voltage Vp1 to a plurality of word lines of memory cells. Threshold voltages of the memory cells are measured to obtain a first threshold voltage distribution for the memory cells. A second program voltage Vp2 is applied to the word lines of the memory cells that had been programmed with the first program voltage Vp1. The threshold voltages of the memory cells that have been programmed with the second program voltage Vp2 are measured to obtain a second threshold voltage distribution for the memory cells. A determination is made whether or not the memory cells that have been programmed with the second program voltage have been programmed properly. If the memory cells are determined to have been programmed properly, then the second program voltage is defined as an ending bias for a programming operation. If the memory cells are determined not to have been programmed properly, the memory cells are programmed using a third program voltage that is higher than the second program voltage.

12 Claims, 6 Drawing Sheets

PROGRAM METHOD OF FLASH MEMORY DEVICE

CROSS-REFERENCES TO RELATED APPLICATIONS

The present application claims priority to Korean patent application number 10-2007-032838, filed on Apr. 03, 2007, which is incorporated by reference in its entirety.

BACKGROUND OF THE INVENTION

The present invention relates to flash memory 10 devices and, more particularly, to a program method which can prevent a disturb phenomenon without increasing a program speed.

Recently, there has been an increasing demand for semiconductor memory devices that can be electrically programmed and erased and retain data without the data being lost even when power is cut off. Further, in order to develop large-capacity memory devices capable of storing lots of data, a high-integration technique of a memory cell memory cell has been developed. To this end, a NAND type flash memory device in which a plurality of memory cells are connected in series to form one string and a plurality of the strings form one memory cell array has been proposed.

In general, a flash memory cell includes a gate in which a tunnel insulating layer, a floating gate, a dielectric layer and a control gate are stacked on a semiconductor substrate, and a junction region formed by the semiconductor substrate at both sides of the gate. The flash memory cell is programmed as hot electrons are injected into the floating gate, and is erased as the injected electrons are discharged by F-N tunneling.

In more detail, in the case of NOR type flash, the program operation of the flash memory cell is performed in a state where a source region of a memory cell and the semiconductor substrate, that is, a bulk region are grounded, the control gate is applied with a positive high voltage (that is, a program voltage, Vpp) (for example, 15V to 20V), and voltage (for example, 5 to 6V) for program is applied to the drain of the memory cell. In the case of NAND type flash, the program operation of the flash memory cell is performed in a state where a positive voltage is applied to a drain select line of a cell array of a string structure to which a plurality of memory cells are connected, voltage of 0V is applied to a source select line of the cell array of the string structure, and 0V is applied to a bit line and the substrate, and a program voltage of 15V to 20V is applied to a word line.

Figure 1:
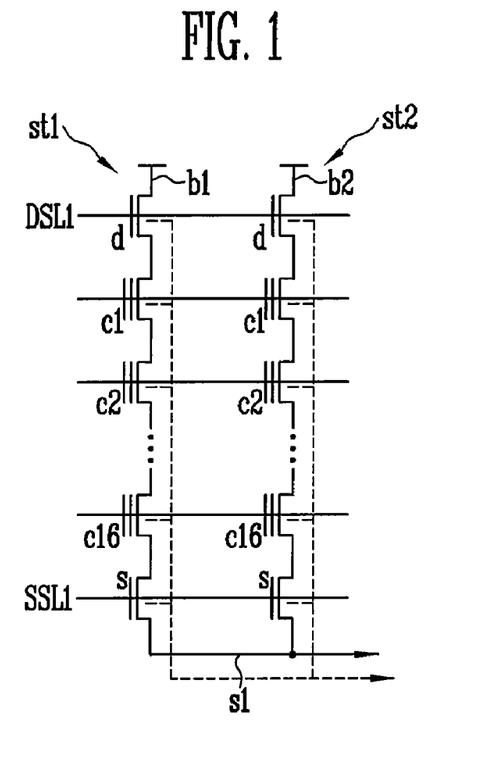
FIG. 1 is a circuit diagram of a cell array of a general flash memory device.

FIG. 1 is a circuit diagram of a cell array of a general flash memory device.

First to sixteenth cells c1 to c16, a string select transistor d and a source select transistor s are connected in series to a first string st1. The first cell c1 has a drain connected to a first bit line b1 through the string select transistor d, and the sixteenth cell c16 has a source connected to a common source line s1 through the source select transistor s. A second string st2 has the same structure as that of the first string st1. The gates of cells existing in the same longitudinal direction (a vertical direction to the bit line) line are connected to corresponding word lines. Though not illustrated in the drawing, the plurality of strings form flash memory.

For a program operation, a selected bit line is applied with ground voltage 0V, and the unselected bit lines are applied with power supply voltage Vcc. Furthermore, a selected word line is applied with program voltage Vpgm (for example 18V), a drain select line DSL1 is applied with power supply voltage (for example 4.5V), and a source select line SSL1 is applied with ground voltage 0V. The unselected word lines are also applied with a pass voltage Vpass (for example 10V). Selected cells under these voltage conditions are programmed individually.

In the program method of the flash memory device, threshold voltage distributions of the program cell are important. A program cell having a threshold voltage that is too high can be turned off at a specific read voltage Vread. Thus, there may be a case where a bypass function cannot be performed. Above phenomenon occurs due to a cell with a very high program speed in the same program voltage. Therefore, in order to prevent the phenomenon, threshold voltage distributions of memory cells are uniformly controlled by means of an Incremental Step Pulse Program (ISPP) method in which the program operation is performed at a relatively low program voltage in the case of a cell having a fast program speed and at a relatively high program voltage in the case of a cell having a slow program speed.

However, the program speed of cells in the memory device may vary depending on the process variation, such as, the thickness of the tunnel insulating layer, which affects the program speed. Accordingly, a start bias in the ISPP method begins at a very low voltage in order to include all these process variations. In other words, if an overall program speed is fast due to process variation, the start bias begins low from the beginning. In the case of a cell having a slower program speed, the program voltage must be increased.

Figure 2:
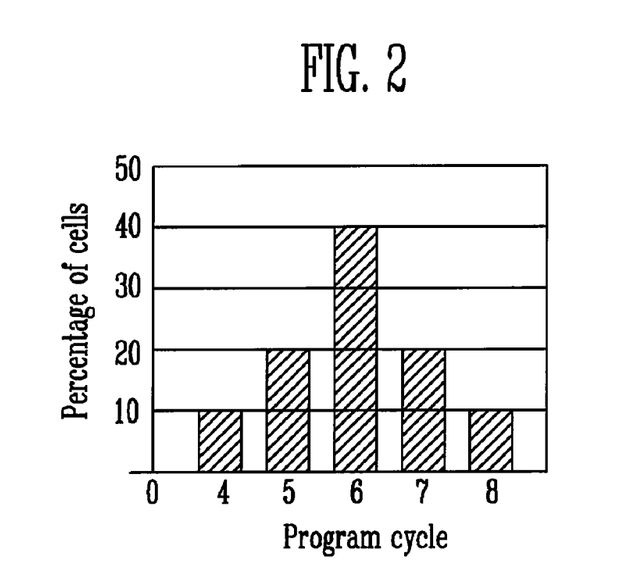
FIG. 2 is a graph illustrating a program cycle number of a conventional ISPP program method.

FIG. 2 illustrates a program operation performed using an incremental step-pulse programming (ISPP) operation. The X-axis denotes the number of program cycles performed, and the Y-axis denotes the percentage of the cells that have been programmed properly. All of the memory cells are programmed after eight program cycles.

In the ISPP method, as in FIG. 2, an overall program operation time is increased. For example, if a start bias begins at a low voltage 1.5V, a program cycle number corresponding to 1.5V is increased. If Vstep is 0.3V and a program cycle is 50 μs, the program operation time is increased by as much as about 250 μs. A program disturb phenomenon, in which a cell-inhibited cell undergoes a shallow program and an erase cell loses its characteristics, is also generated. The ending bias of the program operation is set for the purpose of a cell having a slow program speed. Accordingly, there may occur a problem in which a cell having a fast program speed loses erase cell's characteristics even at the same ending voltage.

SUMMARY OF THE INVENTION

Accordingly, the present invention relates to a program method of a flash memory device, in which it can improve a program operation speed and prevent a disturb phenomenon without increasing the program speed by uniformly maintaining the program cycle number without variation in the threshold voltage.

In an aspect, the present invention provides a method of determining an ending bias voltage in incremental, including the steps of applying a first program voltage to selected memory cells to measure a first threshold voltage of the memory cells; applying a second program voltage to the memory cells to measure a second threshold voltage of the memory cells, the second program voltage being determined by adding the first program voltage to a difference between a lowest threshold voltage among the first threshold voltage and a middle threshold voltage among the first threshold voltage; repeatedly applying a new program voltage to the memory cells to measure a new threshold voltage of the memory cells until the new threshold voltage of the memory cells is higher than a verify voltage, the new program voltage being increased by adding the second program voltage to a difference between a lowest threshold voltage among a threshold voltage which is measured in previous step and a middle threshold voltage among the first threshold voltage; and refining the new program voltage when a lowest threshold voltage among the new threshold voltage of the memory cells is higher than the verify voltage as the ending bias voltage.

In another aspect, the present invention provides a method of programming a flash memory device, including the steps of applying a first program voltage to selected memory cells to measure a first threshold voltage of the memory cells; applying a second program voltage to the memory cells to measure a second threshold voltage of the memory cells, the second program voltage being determined by adding the first program voltage to a difference between a lowest threshold voltage among the first threshold voltage and a middle threshold voltage among the first threshold voltage; repeatedly applying a new program voltage to the memory cells to measure a new threshold voltage of the memory cells until the new threshold voltage of the memory cells is higher than a verify voltage, the new program voltage being increased by adding the second program voltage to a difference between a lowest threshold voltage among a threshold voltage which is measured in previous step and a middle threshold voltage among the first threshold voltage; defining the new program voltage when a lowest threshold voltage among the new threshold voltage of the memory cells is higher than the verify voltage as an ending bias voltage in an incremental step pulse; and applying the incremental step pulse to a word line of the flash memory.

In still another aspect, the present invention provides a method of determining a starting bias voltage in incremental step pulse, including the steps of applying a first program voltage to selected memory cells to measure a first threshold voltage of the memory cells; applying a second program voltage to the memory cells to measure a second threshold voltage of the memory cells, the second program voltage being determined by subtracting a difference between a highest threshold voltage among the first threshold voltage and a middle threshold voltage among the first threshold voltage from the first program voltage; repeatedly applying a new program voltage to the memory cells to measure a new threshold voltage of the memory cells until the new threshold voltage of the memory cells is higher than a verify voltage, the new program voltage being decreased by subtracting a difference between a highest threshold voltage among threshold voltages which are measured in previous step and a middle threshold voltage among the first threshold voltage from the second program voltage; and defining a voltage obtained by subtracting a difference voltage between a middle threshold voltage among the new threshold voltage and a middle threshold voltage among the first threshold voltage from the new program voltage when a lowest threshold voltage among the new threshold voltage of the memory cells is higher than the verify voltage as the starting bias voltage.

In still another aspect, the present invention provides a method of programming a flash memory device, including the steps of applying a first program voltage to selected memory cells to measure a first threshold voltage of the memory cells; applying a second program voltage to the memory cells to measure a second threshold voltage of the memory cells, the second program voltage being determined by subtracting a difference between a highest threshold voltage among the first threshold voltage and a middle threshold voltage among the first threshold voltage from the first program voltage; repeatedly applying a new program voltage to the memory cells to measure a new threshold voltage of the memory cells until the new threshold voltage of the memory cells is higher than a verify voltage, the new program voltage being decreased by subtracting a difference between a highest threshold voltage among threshold voltages which are measured in previous step and a middle threshold voltage among the first threshold voltage from the second program voltage; defining a voltage obtained by subtracting a difference voltage between a middle threshold voltage among the new threshold voltage and a middle threshold voltage among the first threshold voltage from the new program voltage when a lowest threshold voltage among the new threshold voltage of the memory cells is higher than the verify voltage as the starting bias voltage in an incremental step pulse; and applying the incremental step pulse to a word line of the flash memory.

In still another aspect, the present invention provides a method of determining a starting bias voltage in incremental step pulse, including the steps of setting a first starting bias voltage and a first ending bias voltage; applying a program voltage to selected memory cells to program the selected memory cells, the program voltage being stepped-up from the first starting voltage and stopped when a threshold voltage of the memory cell is higher than a verify voltage; detecting a voltage difference between the ending bias voltage and the program voltage when the threshold voltage of the memory cell is higher than the verify voltage; and defining a new starting bias voltage by subtracting the voltage difference from the starting bias voltage.

In still another aspect, the present invention provides a method of programming a flash memory, including the steps of setting a first starting bias voltage and a first ending bias voltage; applying a program voltage to selected memory cells to program the selected memory cells, the program voltage being stepped-up from the first starting voltage and stopped when a threshold voltage of the memory cell is higher than a verify voltage; detecting a voltage difference between the ending bias voltage and the program voltage when the threshold voltage of the memory cell is higher than the verify voltage; defining a new starting bias voltage in an incremental step pulse by subtracting the voltage difference from the starting bias voltage; and applying the incremental step pulse to a word line of the flash memory.

DESCRIPTION OF SPECIFIC EMBODIMENTS

Figure 3:
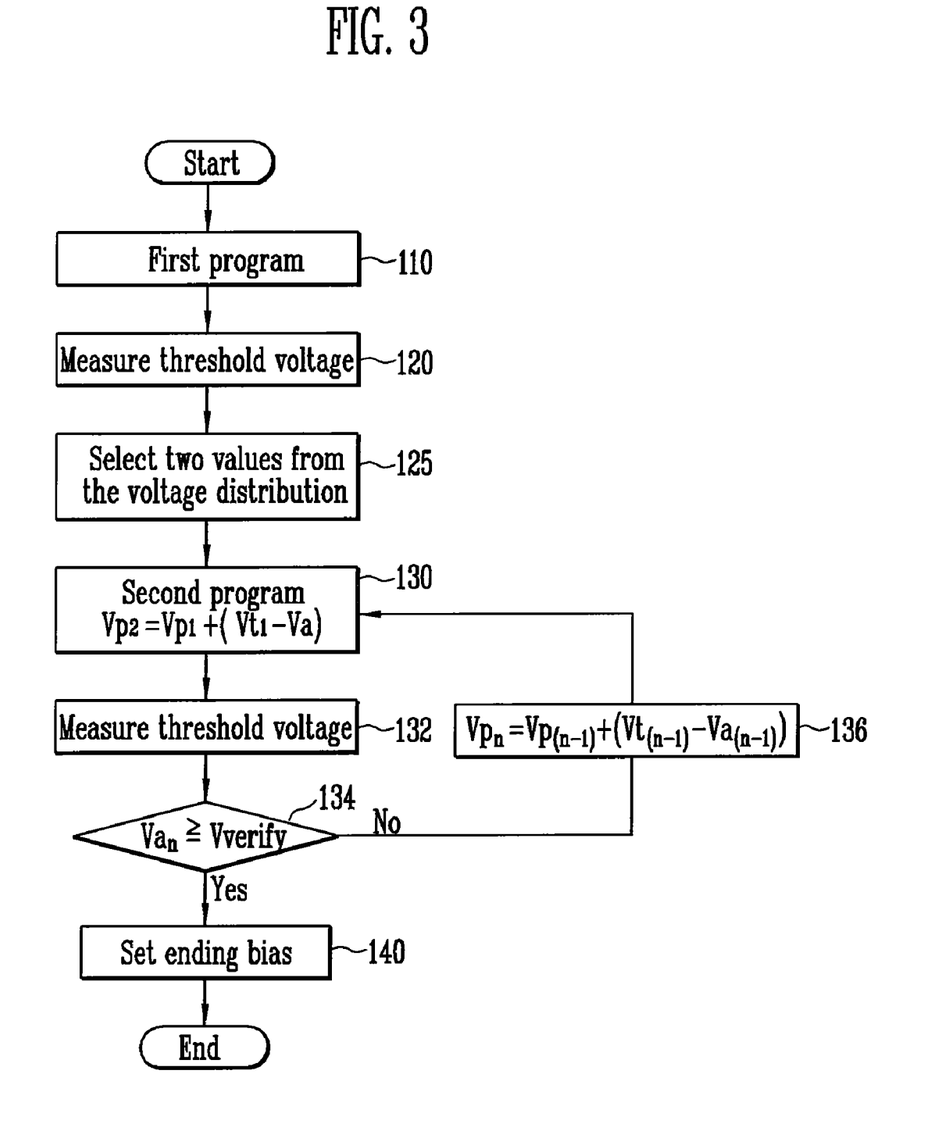
FIG. 3 is a flowchart illustrating a program method of a flash memory device according to a first embodiment of the present invention.

FIG. 3 is a flowchart illustrating a program method of a flash memory device according to a first embodiment of the present invention. The flowchart illustrates a method used to set an ending bias for an ISPP operation. The first embodiment of the present invention relates to a case where flash memory cells are slow cells.

Figure 4A:
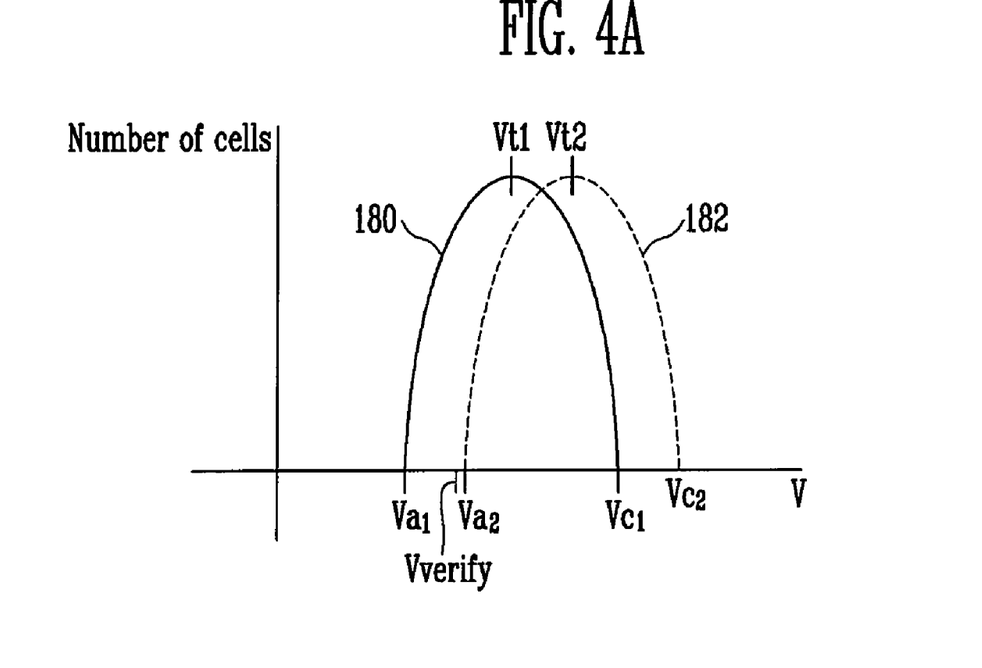
FIGS. 4A and 4B are a view showing threshold voltage distributions illustrating the program method of the flash memory device according to the present invention.
Figure 4B:
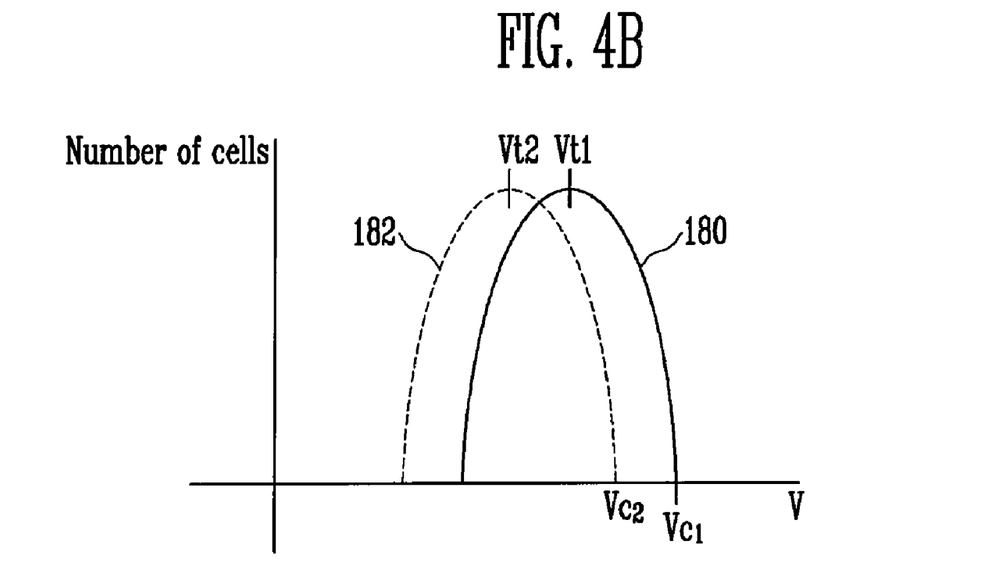

FIGS. 4A and 4B illustrate threshold voltage distributions of a memory device according to the present invention.

Referring to FIGS. 3 and 4A, at step 110, a first program step is performed. In this implementation, the program step is performed on the entire memory cells of a flash memory device. The first program step includes applying a first program voltage to word lines of selected memory cells. The drain select line DSL1 is applied with power supply voltage (for example 4.5V), and the source select line SSL1 is applied with ground voltage 0V. Unselected word lines are applied with the pass voltage Vpass (for example 10V). In this case, selected bit lines are applied with ground voltage 0V and unselected bit lines is applied with power supply voltage Vcc.

At step 120, a threshold voltage scan is performed to measure the threshold voltages of the memory cells programmed in the first program step 110. A threshold voltage distribution 180 of these memory cells is obtained (see FIG. 4A). As known in the art, the threshold voltage of a memory cell is commonly represented in terms of a cell threshold voltage distribution rather than as single threshold voltage value. The voltage distribution 180 is obtained by representing each cell threshold voltage distribution as a single value. In the preset embodiment, the maximum value of the cell threshold voltage distribution is used as the single threshold value for a cell.

At least two values are selected from the threshold voltage distribution 180 (step 125): an intermediate threshold voltage value Vt1 and a low threshold voltage value Va1. The intermediate threshold voltage value Vt1 is the maximum value of the voltage distribution 180 in the present embodiment. That is, the intermediate value Vt1 is the most common threshold voltage value for the cells in the memory device. The low threshold voltage value Va1 is the lowest value in the voltage distribution 180. In another implementation, the intermediate and low values Vt1 and Va1 may have different values as long as the former is greater than the latter.

At step 130, a second program operation is performed on the memory cells by using a second program voltage Vp2. The second program voltage is defined as follows in the present implementation: Vp2=Vp1+(Vt1−Va), where the voltage difference Vt1−Va is added to the first program voltage Vp1.

After the second program operation, the threshold voltages of the memory cells that were programmed are measured (step 132). The second program operation causes the voltage distribution 180 to shift to the right to define a threshold voltage distribution 182 (see FIG. 4A). The voltage distribution 182 defines an intermediate value Vt2 and a low value Va2.

At step 134, a determination is made whether or not the low value Va2 is equal to or greater than a verify voltage Vverify. The verify voltage Vverify may be in the range of 3.4 to 3.8V, but may be in a different range depending on the implementation. If the low value Va2 is equal to or greater than the verify voltage Vverify, then this indicates that the second program voltage is sufficiently high to program the memory cells properly. Therefore, the second program voltage Vp2 is used to set the ending bias of the ISPP operation (step 140). The ending bias is defined by adding the difference of Vt2−Vt1 to the second program voltage Vp2: $V_{ending\_bias}=VP2+(Vt2-Vt1)$. The ending bias may also be defined as: $Vp_n = Vp_{(n-1)}+(Vt_{(n-1)}-Vt_{(n-2)})$, wherein $VP_n$ is the ending bias. If the second program voltage is sufficient to properly program the memory cells, a program voltage higher than the second program voltage is not needed. Setting a higher program voltage as the ending bias would unnecessary result in a longer program time.

On the other hand, if the low value Va2 is determined to be less than the verify voltage Vverify, a higher program voltage is desired for the ending bias for the ISPP operation. A third program voltage is defined using a similar method as that used for the second program voltage Vp2 (step 136). The third program voltage Vp3 is defined as Vp3=Vp2+(Vt1−Va2), where Va2 is a low value of the voltage distribution 182. More generically, step 136 defines the next program voltage $Vp_n=Vp_{(n-1)}+(Vt_1-Va_{(n-1)})$, where n refers to the number of times the program voltage has been increased.

Steps 130-136 are repeated until the low value $Va_n$ of the voltage distribution becomes equal to or greater than the verify voltage Vverify.

Once the ending bias for the ISPP operation has been set, an erase operation is performed on the entire memory cells in the device to clean-up the memory cells that have been programmed during the above steps for setting the ending bias.

Thereafter, the memory device is ready to apply the ISPP operation. At this time, a start bias for the ISPP may also be set in addition to the ending bias.

The method of setting the ending bias of the ISPP operation according to the first embodiment of the present invention is explained in more detail below.

First, a first program voltage for the ISPP operation is defined. The first program voltage may be defined as 17V, which is sufficiently high to program a certain percentage of the memory cells in one program cycle but is lower than the ending bias.

As the first program voltage (or first ISPP voltage) for an ISPP operation is applied to the word line of a selected page, memory cells of the selected page are programmed.

The threshold voltage of the memory cells is then checked by supplying the word lines with a verify voltage. It is then determined whether the memory cells have been properly programmed depending on whether the threshold voltage is higher than the verify voltage. If, as a result of the determination, the memory cells are determined not to have been properly programmed, the first ISPP voltage is increased by a specific step voltage (for example, 0.3V). The program operation is performed by using a second program voltage (or second ISPP voltage) for the ISPP operation. The program operation is repeated until the ISPP voltage has been raised to the ending bias of the ISPP operation and the memory cells have been programmed using the ending bias.

Figure 5:
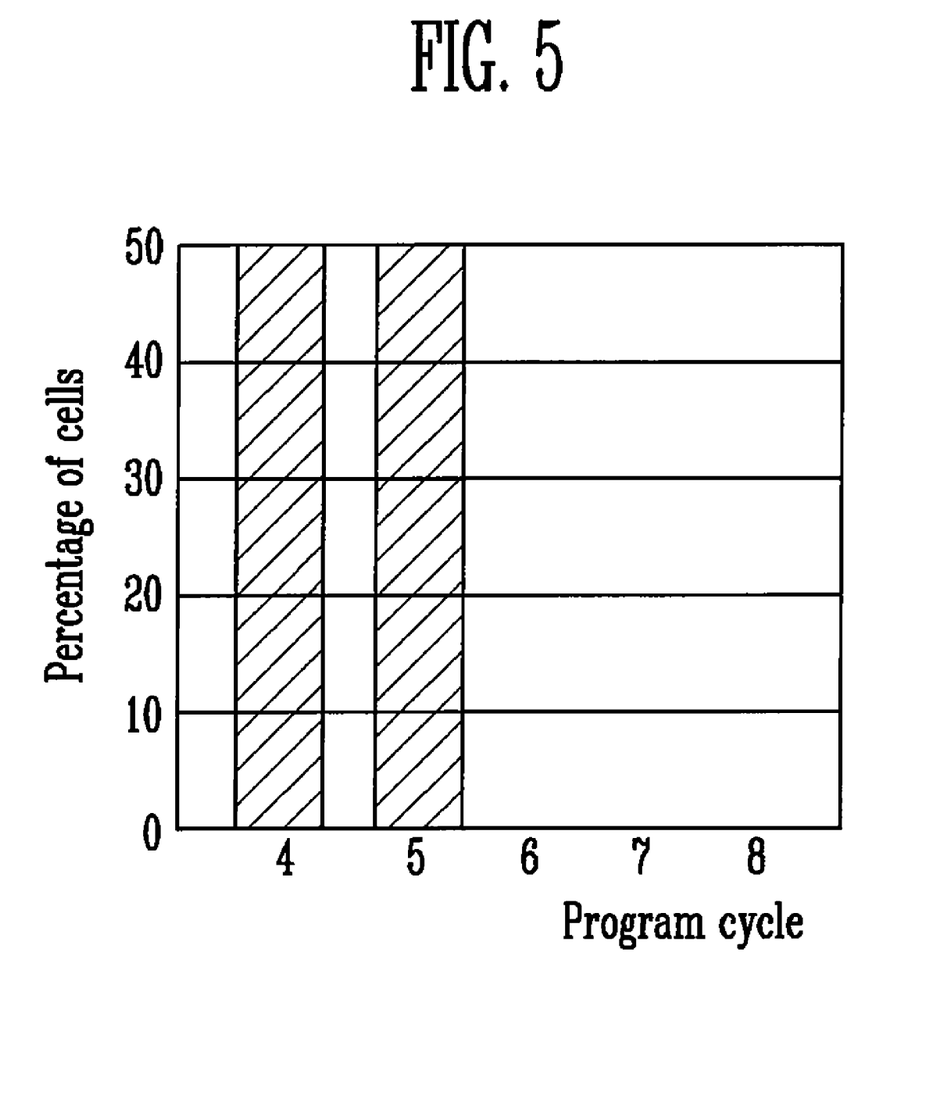
FIG. 5 is a graph illustrating a program cycle number according to a first embodiment of the present invention.

Referring to FIG. 5, in the ISPP program method of the present embodiment, the program cycle number is uniformly performed as many as the cycle number, which is set regardless of variation in the threshold voltage of the program. It is therefore possible to shorten the program time. That is, ending bias and start bias of the IPSS are accurately set so that a step number of the ISPP program is decreased.

Figure 6:
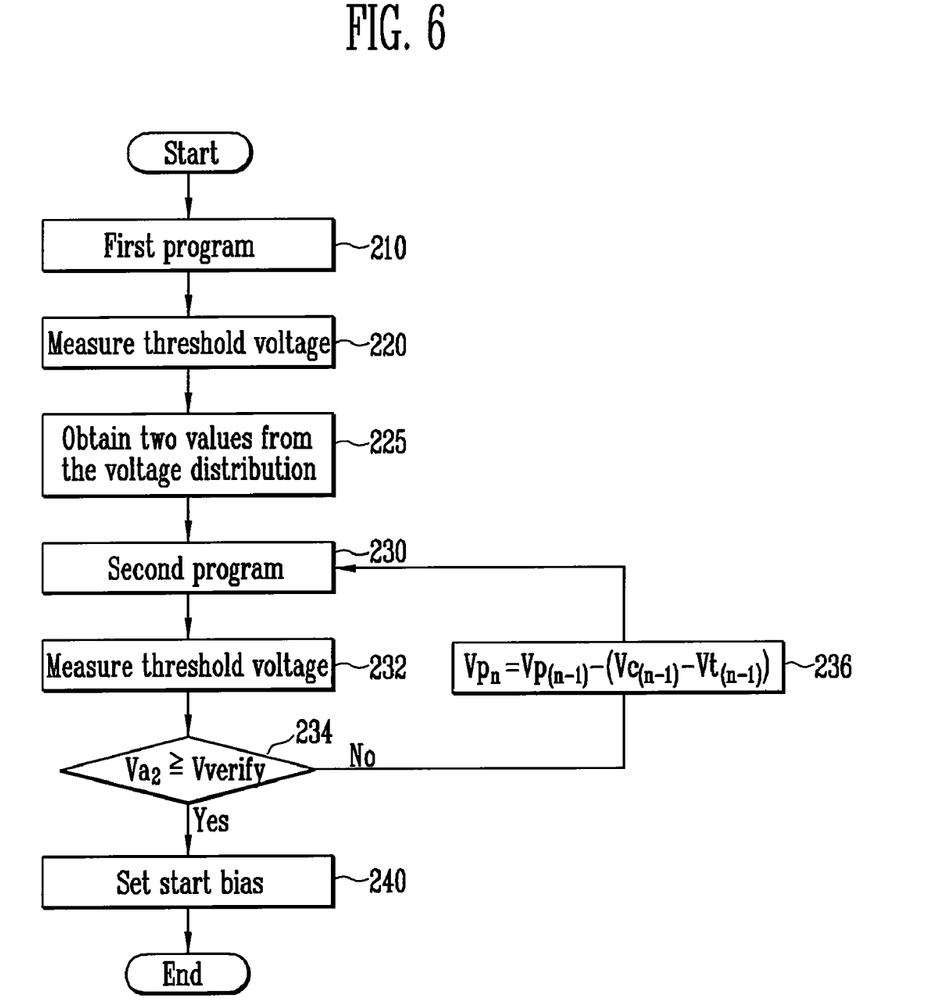
FIG. 6 is a flowchart illustrating a program method of a flash memory device according to a second embodiment of the present invention.

FIG. 6 is a flowchart illustrating a program method of a flash memory device according to a second embodiment of the present invention. The second embodiment of the present invention relates to an example when flash memory cells are fast cells.

The flowchart relates to a setting the start bias for an ISPP operation. At step 210, a first program operation is performed on the entire memory cells of a flash memory device. Word lines associated with selected memory cells are applied with the first program voltage Vp1. The drain select line DSL1 is applied with power supply voltage (for example, 4.5V), and the source select line SSL1 is applied with ground voltage 0V. Unselected word lines are applied with pass voltage Vpass (for example, 10V). In this case, selected bit lines are applied with ground voltage 0V and unselected bit lines is applied with power supply voltage Vcc.

The threshold voltage of the memory cells programmed in the step 210 is measured to obtain the threshold voltage distribution 180 (see FIG. 4A) of the memory device (step 220). As known by those skilled in the art, the threshold voltage of a memory cell is commonly represented as a cell threshold voltage distribution rather than a single threshold voltage value. The voltage distribution 180 (or device voltage distribution) is obtained by representing each cell threshold voltage distribution as a single voltage value. In the present embodiment, the signal voltage value is the maximum value of the cell threshold voltage distribution.

At least two values are selected from the threshold voltage distribution 180 (step 225) an intermediate threshold voltage value Vt1 and a high threshold voltage value Vc1. The intermediate threshold voltage value Vt1 is the maximum value of the voltage distribution 180 in the present embodiment. That is, the intermediate value Vt1 is the most common threshold voltage value for the cells in the memory device. The high threshold voltage value Vc1 is the highest value in the voltage distribution 180. In another implementation, the intermediate and high values Vt1 and Vc1 may have different values as long as the former is less than the latter.

At step 230, a second program operation is performed using a second program voltage Vp2. The second program voltage is defined as, Vp2=Vp1−(Vc1−Vt1), where the voltage difference Vc1−Vt1 is subtracted from the first program voltage Vp1.

Referring to FIG. 4B, after the second program operation, threshold voltages of the memory cells are measured (step 232). The voltage distribution shifts to the left and a voltage distribution 182 is defined. The voltage distribution 182 defines an intermediate value Vt2 and a high value Vc2.

At step 234, a determination is made whether or not the low value Va2 is equal to or greater than a verify voltage Vverify. The verify voltage Vverify may be in the range of 3.4 to 3.8V, but may be in a different range depending on the implementation. If the low value Va2 is equal to or greater than the verify voltage Vverify, then this indicates that the second program voltage is sufficiently high to program the memory cells properly.

If the low value Va2 is less than the verify voltage Vverify, then a third program voltage is obtained (step 236). The third program voltage is obtained using the following equation, $Vp_n=Vp_{(n-1)}-(Vc_{(n-1)}-Vt_1)$, where the $Vp_n$ is the third program voltage (or the next program voltage), and $Vc_{(n-1)}$ is the highest threshold voltage in the voltage distribution associated with $Vp_{(n-1)}$, and $Vt_1$ is the maximum value of the voltage distribution associated with $Vp_{(n-1)}$. Steps 230-236 are repeated until the low value $Va_n$ is equal to or greater than the verify voltage Vverify.

If the lowest threshold voltage Va2 is equal to or greater than the verify voltage Vverify, a start bias is set using the program voltage that was last used in step 230 (step 240). The start bias is obtained by the following equation: $Vstart=Vp_n-(Vt_{n-1}-Vt_1)$, where Vstart is the starting bias, and $Vp_n$ is the program voltage that was used to properly program the memory cells, and $Vt_n$ is the maximum value associated with a threshold voltage distribution associated with $Vp_n$. If the second program voltage has been used to program the memory cells properly, $Vp_n$ is the second program voltage, Vt2 is the maximum value of the voltage distribution 182, and Vt1 is the maximum value of the voltage distribution 180. For example, if the second program voltage Vp2 was sufficient to cause the Va2 to be equal to or greater than the verify voltage Vverify, then the start bias Vstart is defined as Vstart=Vp2−(Vt2−Vt1). The start bias is used for the ISPP operation.

An erase operation is then performed to erase the memory cells programmed by the program operations performed above to set the start bias for the ISPP operation.

The ISPP operation is then performed by using the start bias that has been set according to the above method.

First, a start bias (e.g., Vstart3=Vp2−(Vt2−Vt1)), is set. An ending bias is set. The start bias can also be set as the ending bias.

The start bias is applied as the first ISPP voltage to the word line of a selected page to program the memory cells of the selected page.

Thereafter, the threshold voltages of the memory cells are checked by applying the word lines with a verify voltage. The memory cells are programmed properly if their threshold voltages are higher than the verify voltage. If the threshold voltage of any of the memory cells is lower than the verify voltage, the programming is deemed not to have been performed properly. The first ISPP voltage is increased by a specific amount (for example, 0.3V), thereby obtaining a second ISPP voltage. The selected memory cells are programmed again using the second ISPP voltage. The ISPP voltage rise operation and the program operation are repeated until the ISPP voltage is equal to the ending bias.

Figure 7:
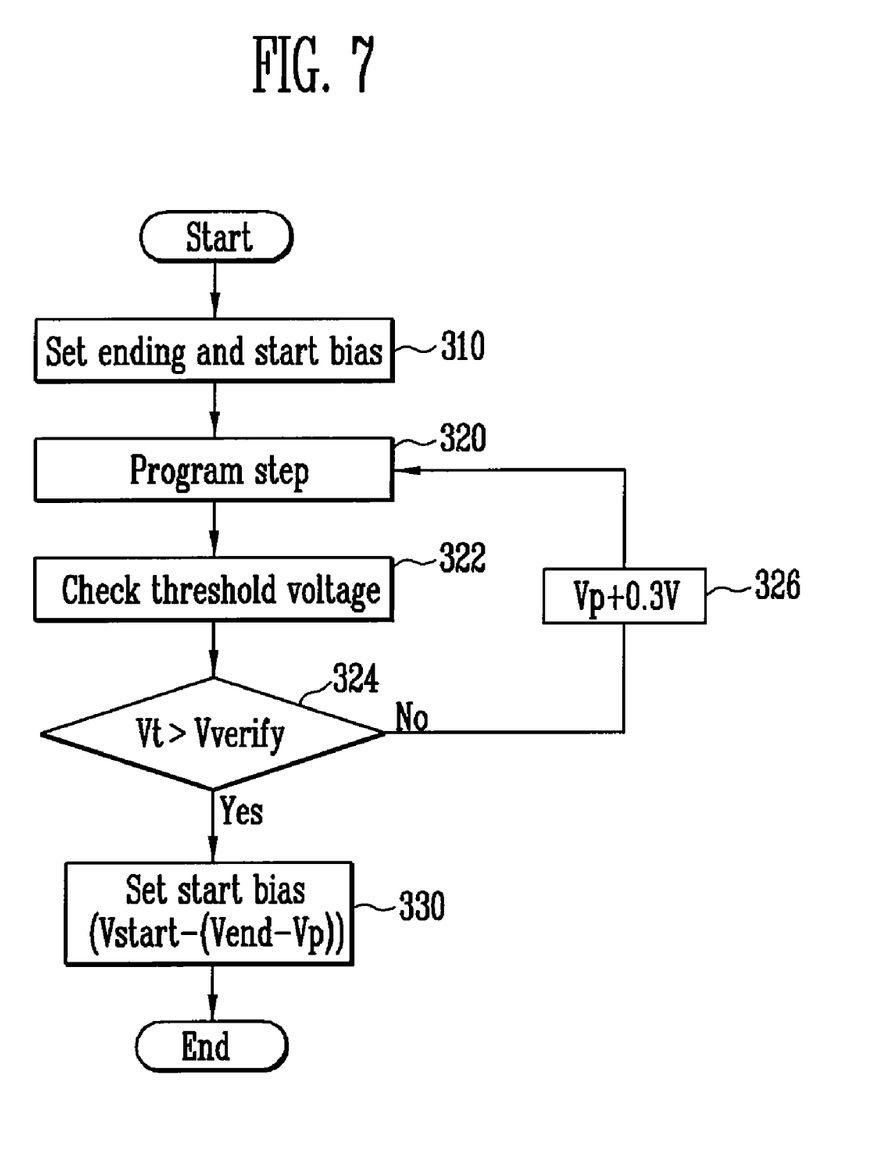
FIG. 7 is a flowchart illustrating a program method of a flash memory device according to a third embodiment of the present invention.

FIG. 7 is a flowchart illustrating a program method of a flash memory device according to a third embodiment of the present invention. The flowchart illustrates a method of setting a start bias for the ISPP operation.

At step 310, an ending bias Vend of an ISPP operation is set. The ending bias Vend is 20V in the present embodiment, but may be of a different value. An initial start bias Vstart is also set. The start bias Vstart is 15V in the present embodiment, but may be of a different value.

At step 320, selected memory cells are programmed. A voltage that is lower than the ending bias Vend is selected as a program bias Vp. The program bias Vp is lower than the voltage in which variation in the threshold voltage depending on process variation is subtracted from the ending bias Vend. The program bias Vp is a value subtracted the threshold voltage Vt changed according to process condition in the device manufacturing process from the ending bias Vend.

During the program step above, word lines of selected memory cells are applied with the program voltage Vp. The drain select line DSL1 is applied with power supply voltage (for example 4.5V). The source select line SSL1 is applied with ground voltage 0V. Unselected word lines are applied with pass voltage Vpass (for example 10V). In this case, selected bit lines can be applied with ground voltage 0V, and unselected bit lines can be applied with the power supply voltage Vcc.

The threshold voltage Vt of the selected/programmed memory cells are checked (step 322). If the threshold voltage Vt is not higher than a verify voltage Vverify (step 324), the program bias is increased by a given amount, e.g., 0.3V (step 326). The voltage amount increased is not limited to 0.3V. It can be within a range of 0.1V to 1V by taking the number of the repeated program operation and variation in the threshold voltage depending on process variation into consideration.

If the threshold voltage Vt is higher than the verify voltage Vverify (i.e., the programming has been determined to have been done properly), the program bias Vp is used to define a new start bias Vstart$_{(new)}$ (step 330), where Vstart$_{(new)}$= Vstart−(Vend−Vp). The new start bias Vstart$_{(new)}$ is found by substracting the voltage difference Vend−Vp from the initial start bias Vstart that had been set at step 310. For example, if the initial start bias Vstart is set as 15V at step 310, and the difference between Vend and Vp is 2V, then the new start bias Vstart$_{(new)}$, is set as 13V.

Once the new start bias Vstart$_{(new)}$ has been set, the memory cells are erased to clean-up the memory device and undo the programs performed above in setting the start bias.

The ISPP operation according to a third embodiment of the present invention is described below. As a first step in programming, a new start bias Vstart$_{(new)}$ is applied as a first ISPP voltage to the word line of the memory cells selected for programming.

The threshold voltage of the memory cells is checked by supplying the word lines with a verify voltage. If the memory cells do not turn on, then the memory cells are determined to have been programmed properly, i.e., the threshold voltage is higher than the verify voltage. If any of the memory cells is turned on, it is determined that the memory cells have not been programmed properly. The first ISPP voltage is increased by a given amount (for example, 0.3V) to obtain a second ISPP voltage. The memory cells are programmed again using the second ISPP voltage. The memory cells repeatedly programmed until the memory cells are verified to have been programmed properly, or until the ISPP voltage has been raised to the ending bias.

As described above, according to the present invention, a start bias is set according to threshold voltage distributions of memory cells. A shallow program phenomenon occurring in cells having a fast program speed according to a unique program speed of the memory cells can be prohibited. It is therefore possible to prevent a disturb phenomenon of a device.

Further, threshold voltage distributions of a programmed memory device are measured using a specific program voltage, a threshold voltage having an intermediate value of the threshold voltage distributions is set to a representative threshold voltage, and a program operation is repeatedly performed until the low threshold voltage is higher than the verify voltage while changing the program voltage as much as a difference with the lowest threshold voltage. At this time, an ending bias of the ISPP program operation is set by adding or subtracting the difference between the threshold voltage and the representative threshold voltage to or from a changed program voltage. Thus, the program cycle number can be uniformly maintained regardless of variation in the threshold voltage. It is therefore possible to enhance the program operation speed.

Although the foregoing description has been made with reference to the specific embodiments, it is to be understood that changes and modifications of the present patent may be made by the ordinary skilled in the art without departing from the spirit and scope of the present patent and appended claims.

What is claimed is:

1. Method of determining an ending bias voltage in incremental step pulse comprising:
   applying a first program voltage to selected memory cells to measure a first threshold voltage of the memory cells;
   applying a second program voltage to the memory cells to measure a second threshold voltage of the memory cells, the second program voltage being determined by adding the first program voltage to a difference between a lowest threshold voltage among the first threshold voltage and a middle threshold voltage among the first threshold voltage;
   repeatedly applying a new program voltage to the memory cells to measure a new threshold voltage of the memory cells until the new threshold voltage of the memory cells is higher than a verify voltage, the new program voltage being increased by adding the second program voltage to a difference between a lowest threshold voltage among a threshold voltage which is measured in previous step and a middle threshold voltage among the first threshold voltage; and
   defining the new program voltage when a lowest threshold voltage among the new threshold voltage of the memory cells is higher than the verify voltage as the ending bias voltage.

2. The method of claim 1, wherein the first threshold voltage is measured by applying a positive voltage to a drain selection line associated with the memory cells, a zero (0) volt to a source selection line associated with the memory cells and a pass voltage to a word line of non selected memory cells, a zero (0) volt to a bit line associated with the memory cells and a Vcc voltage to a bit line of non selected memory cells.

3. Method of programming a flash memory device comprising:
   applying a first program voltage to selected memory cells to measure a first threshold voltage of the memory cells;
   applying a second program voltage to the memory cells to measure a second threshold voltage of the memory cells, the second program voltage being determined by adding the first program voltage to a difference between a lowest threshold voltage among the first threshold voltage and a middle threshold voltage among the first threshold voltage;
   repeatedly applying a new program voltage to the memory cells to measure a new threshold voltage of the memory cells until the new threshold voltage of the memory cells is higher than a verify voltage, the new program voltage being increased by adding the second program voltage to a difference between a lowest threshold voltage among a threshold voltage which is measured in previous step and a middle threshold voltage among the first threshold voltage;
   defining the new program voltage when a lowest threshold voltage among the new threshold voltage of the memory cells is higher than the verify voltage as an ending bias voltage in an incremental step pulse; and
   applying the incremental step pulse to a word line of the flash memory.

4. The method of claim 3, further comprising a step of erasing the memory cells after the defining step.

5. Method of determining a starting bias voltage in incremental step pulse comprising:
   applying a first program voltage to selected memory cells to measure a first threshold voltage of the memory cells;
   applying a second program voltage to the memory cells to measure a second threshold voltage of the memory cells, the second program voltage being determined by subtracting a difference between a highest threshold voltage among the first threshold voltage and a middle threshold voltage among the first threshold voltage from the first program voltage;
   repeatedly applying a new program voltage to the memory cells to measure a new threshold voltage of the memory cells until the new threshold voltage of the memory cells is higher than a verify voltage, the new program voltage being decreased by subtracting a difference between a highest threshold voltage among threshold voltages which are measured in previous step and a middle threshold voltage among the first threshold voltage from the second program voltage; and defining a voltage obtained by subtracting a difference voltage between a middle threshold voltage among the new threshold voltage and a middle threshold voltage among the first threshold voltage from the new program voltage when a lowest threshold voltage among the new threshold voltage of the memory cells is higher than the verify voltage as the starting bias voltage.

6. The method of claim 5, wherein the first threshold voltage is measured by applying a positive voltage to a drain selection line associated with the memory cells, a zero (0) volt to a source selection line associated with the memory cells and a pass voltage to a word line of non selected memory cells, a zero (0) volt to a bit line associated with the memory cells and a Vcc voltage to a bit line of non selected memory cells.

7. Method of programming a flash memory device comprising:

applying a first program voltage to selected memory cells to measure a first threshold voltage of the memory cells;

applying a second program voltage to the memory cells to measure a second threshold voltage of the memory cells, the second program voltage being determined by subtracting a difference between a highest threshold voltage among the first threshold voltage and a middle threshold voltage among the first threshold voltage from the first program voltage;

repeatedly applying a new program voltage to the memory cells to measure a new threshold voltage of the memory cells until the new threshold voltage of the memory cells is higher than a verify voltage, the new program voltage being decreased by subtracting a difference between a highest threshold voltage among threshold voltages which are measured in previous step and a middle threshold voltage among the first threshold voltage from the second program voltage;

defining a voltage obtained by subtracting a difference voltage between a middle threshold voltage among the new threshold voltage and a middle threshold voltage among the first threshold voltage from the new program voltage when a lowest threshold voltage among the new threshold voltage of the memory cells is higher than the verify voltage as the starting bias voltage in an incremental step pulse; and applying the incremental step pulse to a word line of the flash memory.

8. The method of claim 7, further comprising a step of erasing the memory cells after the defining step.

9. Method of determining a starting bias voltage in incremental step pulse comprising:

setting a first starting bias voltage and a first ending bias voltage;

applying a program voltage to selected memory cells to program the selected memory cells, the program voltage being stepped-up from the first starting voltage and stopped when a threshold voltage of the memory cell is higher than a verify voltage;

detecting a voltage difference between the ending bias voltage and the program voltage when the threshold voltage of the memory cell is higher than the verify voltage; and defining a new starting bias voltage by subtracting the voltage difference from the starting bias voltage.

10. The method of claim 9, wherein the applying step is performed by applying a positive voltage to a drain selection line associated with the memory cells, a zero (0) volt to a source selection line associated with the memory cells and a pass voltage to a word line of non selected memory cells, a zero (0) volt to a bit line associated with the memory cells and a Vcc voltage to a bit line of non selected memory cells.

11. The method of claim 10, further comprising a step the memory cells after the defining step.

12. Method of programming a flash memory comprising:

setting a first starting bias voltage and a first ending bias voltage;

applying a program voltage to selected memory cells to program the selected memory cells, the program voltage being stepped-up from the first starting voltage and stopped when a threshold voltage of the memory cell is higher than a verify voltage;

detecting a voltage difference between the ending bias voltage and the program voltage when the threshold voltage of the memory cell is higher than the verify voltage;

defining a new starting bias voltage in an incremental step pulse by subtracting the voltage difference from the starting bias voltage; and applying the incremental step pulse to a word line of the flash memory.

* * * * *